United States Patent [19]

Ortmann

[11] 4,079,310
[45] Mar. 14, 1978

[54] ENGINE ANALYZING DEVICE

[76] Inventor: James H. Ortmann, 170 Fairfield Dr., North Kingstown, R.I. 02852

[21] Appl. No.: 720,931

[22] Filed: Sep. 7, 1976

[51] Int. Cl.² .............................................. G01R 13/42
[52] U.S. Cl. ........................................ 324/15; 324/19
[58] Field of Search .................................... 324/15, 19

[56] References Cited

U.S. PATENT DOCUMENTS

| 1,495,619 | 5/1924 | Thaw | 324/15 |
| 2,125,277 | 8/1938 | Haupt | 324/19 |
| 2,153,944 | 4/1939 | Tawyer | 324/15 |
| 3,002,377 | 10/1961 | Lanham et al. | 324/19 X |

FOREIGN PATENT DOCUMENTS

| 991,265 | 6/1976 | Canada | 324/15 |
| 627,525 | 6/1927 | France | 324/15 |

*Primary Examiner*—Stanley T. Krawczewicz
*Attorney, Agent, or Firm*—Robert J. Doherty

[57] ABSTRACT

A device for analyzing spark ignition type engines is disclosed wherein the electrical output from the high voltage side of the engine may be directed in a variety of paths through the device so that the spark of each cylinder jumping a gap provided therein may be viewed singly or in comparison with that of the other cylinders both in running and nonrunning engine conditions. Furthermore individual cylinders may be shorted out to determine the effect of the cylinders performance to the entire engine.

8 Claims, 5 Drawing Figures

U.S. Patent March 14, 1978 4,079,310
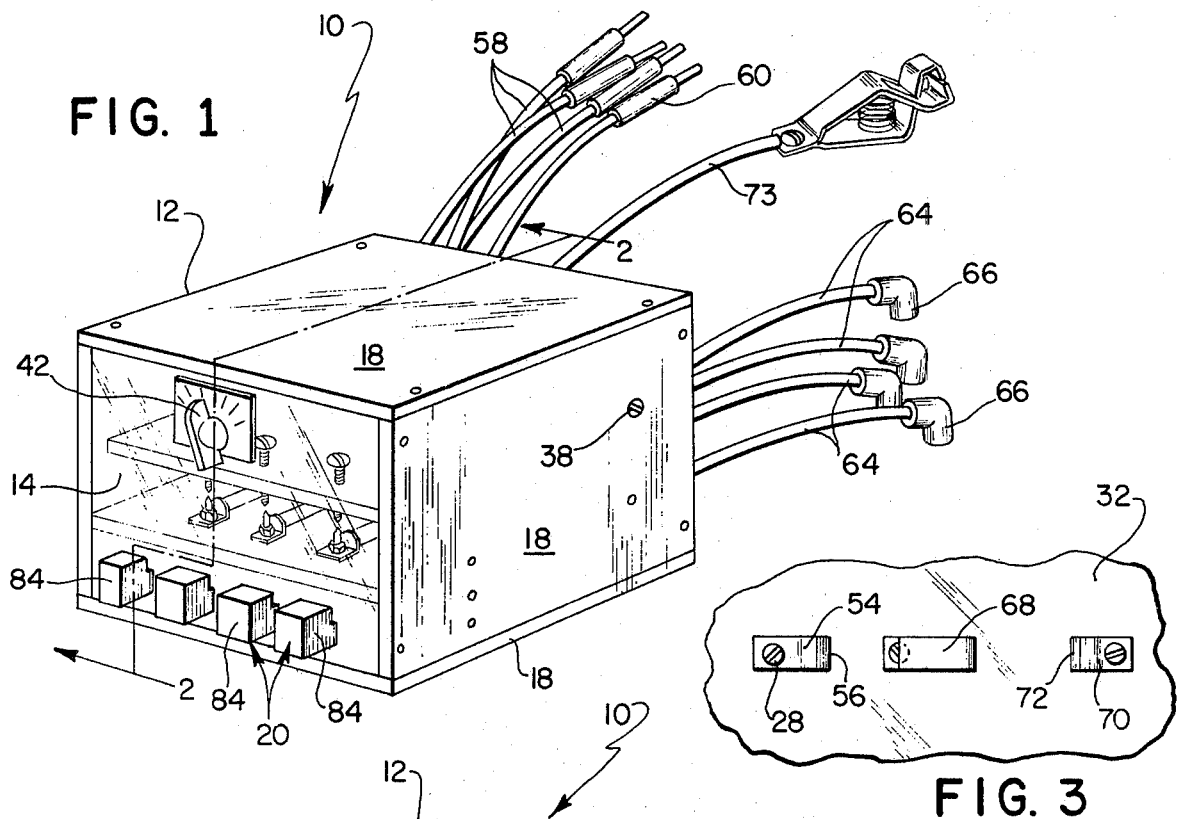
FIG. 1
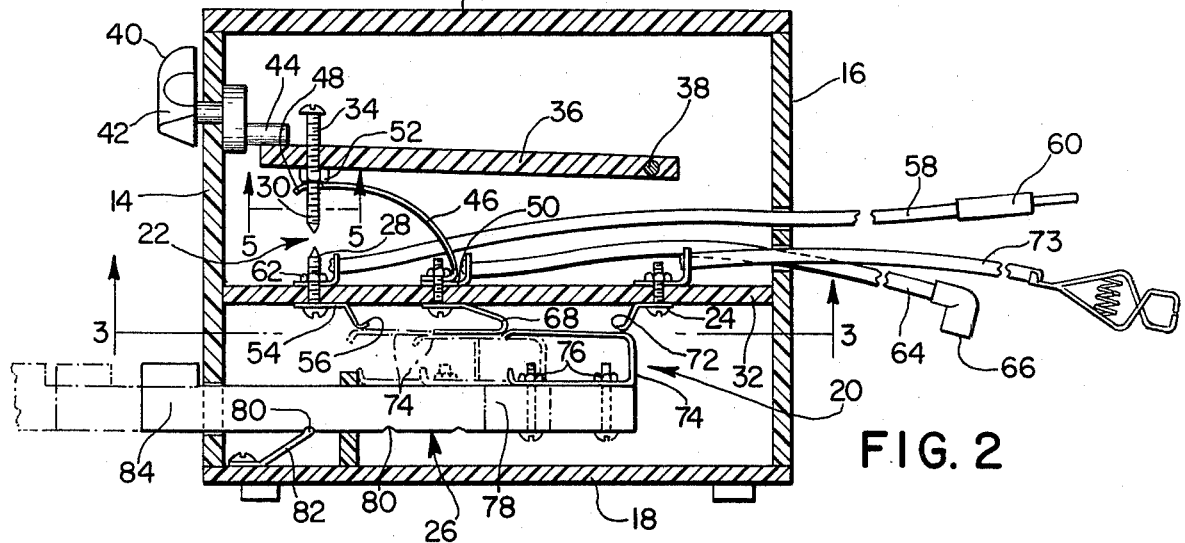
FIG. 2
FIG. 3
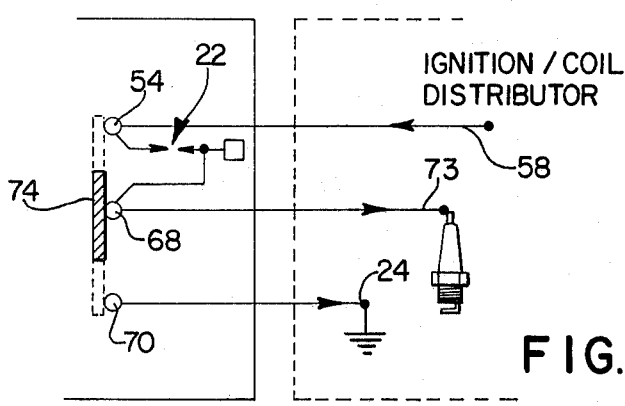
FIG. 4
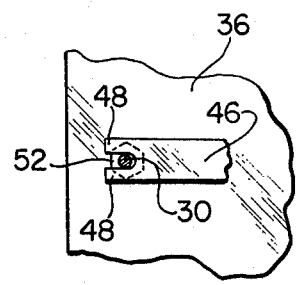
FIG. 5

ENGINE ANALYZING DEVICE

BACKGROUND OF THE INVENTION

This invention relates to a device for analyzing engine ignition systems. It is particularly adapted to assist repair persons in diagnosing ignition and power faults in small engines such as outboard or marine engines of the spark ignition types either in place or in repair shops. It is presently known to conduct a series of engine analyzing tests on such engines by means of an oscilloscope which when equipped with special auxiliary devices can when connected to both the low and high voltage portions of the spark ignition system of an engine, analyze, compare and even quantify ignition faults of such engines. However oscilloscopes and their auxiliary diagnostic equipment are extremely expensive and the analysis techniques utilized therewith are somewhat complex to learn. However, not withstanding the wide spread availability of such oscilloscope systems, many voltage diagnostic tests can be accomplished without resort to such expensive equipment and accordingly a need and a market exists for such less complex and accordingly less expensive equipment.

Some of such less expensive equipment has been only recently introduced while other examples of such equipment have been available for a long time. Generally such prior art devices include those which test spark efficiency by lighting of a neon or other light and those which singly observe a spark gap jump. The relative spark intensity of several cylinders of an engine however cannot be determined by observing a single spark. Thus it would be advantageous to be able to view the several sparks of multiple cylinder engines simultaneously so that a direct comparison thereof can be made. Many of these devices also do not provide a grounding circuit wherein the availability of spark while the engine is not running can be determined.

Representative of such prior art devices are disclosed in the following U.S. Pat. Nos.: 1,915,709 issued June 27, 1933; 1,948,882 issued Feb. 27, 1934, 2,317,263 issued Apr. 20, 1943; 2,665,408 issued Jan. 5, 1954; 2,841,761 issued July 1, 1958; 3,521,157 issued July 21, 1970; 3,763,421 issued Oct. 2, 1973; 3,806,796 issued Apr. 23, 1974 and 3,828,246 issued Aug. 6, 1974.

Despite the availability of the above devices, a need exists for a single device which can be conveniently operated in a simple and efficient manner for analyzing not only the high voltage output of the ignition system fed to each of the several spark plugs of a multi cylinder engine but further providing for the simultaneous observation of the spark gap of each such electrical circuit. Attributes which can be advantageously incorporated in such a device would be the ability to run the engine in a normal manner while connected thereto, provision for the modification of the spark gap within the device without shutting off the engine, and the ability to selectively shunt out the ignition to any one or multiple numbers of the spark plugs to determine the power loss, if any, of these cylinders as measured by the drop of revolutions per minute of the engine itself.

It is accordingly a primary object of the present invention to provide such an engine analyzer device having the above attributes which can be used in a safe and efficient manner.

This and other objects as will become hereinafter more apparent are accomplished by the provision of an engine analyzing device for testing both ignition and combustion power of engine cylinders comprising a housing including a directly observable and adjustable spark gap having electrical connections on opposite sides thereof and including a ground connection, means for connecting the high tension output of one or more engine cylinders to one side of said gap and the spark plug of said cylinder or cylinders to the other side thereof, and a switch movable to first, second and third positions wherein the first position connects the spark plug side of said gap with said ground whereby high tension voltage is directed through said gap and then to ground, said second position makes no connection between said gap sides and ground whereby high tension voltage is directed through said gap and then to the spark plug of said cylinder and said third position interconnects said opposite sides of said gap whereby high tension voltage by passes said gap and is directed directly to said spark plug.

DESCRIPTION OF THE DRAWING

FIG. 1 is a perspective view showing the engine analyzing device of the present invention and particularly the outer portions of the housing therefor;

FIG. 2 is a partial sectional view taken along the line 2—2 and shows in particular the in line relationship to the various contacts wherein various electrical circuits are made and broken by means of switch contact therewith;

FIG. 3 is a cross sectional view taken along the line 3—3 of FIG. 2 and showing one switch circuit thereof, the remaining switch circuits having been removed for purposes of clarity;

FIG. 4 is an electrical diagram showing the various possible circuits for one of the switch assemblies within the device; and FIG. 5 is a partial sectional view showing in particular the manner in which the upper set of points are individually adjustable.

DESCRIPTION OF THE INVENTION

Turning now to drawings and in particular to FIG. 1 thereof, the engine analyzer 10 of the present invention includes a housing 12 preferably of box-like construction and constructed of suitable electrical insulating material including the resinous plastic compositions such as acrylics, polystyrene and polyethlene materials. The housing 12 includes front and rear panels 14 and 16 respectively and a plurality of side panels 18 to fully enclose the various components and structure housed therewithin. Complete enclosure within the housing 12 is a desirable although not a completely necessary feature of the invention. Any suitable means as are known in the art may be utilized to fasten the various panels forming the housing 12 together.

It is within the housing 12, that at least one and preferably a plurality of switch assemblies 20 are provided. Each such assembly 20 is spaced in side-by-side relationship to each other within the housing and is capable of being operated independently, that is, each switch assembly 20 being designed to test or analyze ignition systems the ignition and power system of one cylinder of a spark ignition type engine having a plurality of such cylinders. Although four such switch assemblies 20 are depicted in the drawings as such conveniently provides for handling up to four cylinder engines in a single device and by stacking side-by-side or over and under of two or more such devices, analysation of even larger multiple cylinder engines can be effected. It should however be brought out that any number of switch assemblies may be incorporated within the present device.

Each such switch assembly 20 includes a spark gap 22 and a ground connection 24 as well as a sliding switch member 26. The spark gap 22 in turn includes a pair of needle like pointed members 28 and 30 disposed in opposed position from one another and movable towards and away from each other to adjust the gap 22 as will be hereinafter more fully brought out. Part of the structure including lower points 28 forming gaps 22 is positioned on a fixed supporting or plate surface 32 preferably disposed in an intermediate position within the housing 12 and secured thereto by any suitable means. Also upper points 30 are positioned within a plurality of spaced threaded openings 34 provided within the forward portion of a second and movable supporting plate 36. Such plate 36 is pivotally mounted within the housing as by interconnection pins 38 passing through both side panels 18 and projecting into such plate 36 at one end thereof to permit vertical movement of the forward portion of the plate 36 around the pivot points provided by the pins 38. In this manner then, the spark gaps 22 are simultaneously adjustable. Such adjustability is effected by an actuation device 40 in the form of a knob 42 outwardly projecting from the front panel 14 of the housing 12. Rotation of the knob through a 180° arc moves a cam pin 44 which in turn contacts the upper surface of the forward end of the pivot plate 36 and moves such down to vary the opening of the spark gap 22. Upward movement of the plate 36 is provided by a leaf spring 46 having at one end thereof a bifurcated terminus 48 for receipt of that portion of that upper needle like member 30 which projects downwardly beneath the pivot plate 36 and fixed in position at the other end thereof through attachment to an electrical connection 50 disposed at a longitudinal intermediate point along the fixed support 32. This connection 50 also in part forms the spark plug side of the electrical connection to the spark gap 22 as will hereinafter be more clearly brought out. Each upper point 30 may also be independently vertically adjustable through the provision of mating screw threads provided in the openings 34 through pivot plate 36 and locked in place by jam nut 52. It should be noted that the bifurcated terminus 48 of leaf springs 46 contact the bottom surface of the jam nuts 52 and those portions of the shaft of points 30 projecting downwardly therefrom so that some longitudinal play is in effect provided so that the pivot plate movement will not cause binding of the leaf springs 46.

The lower needle point 28 in effect forms one side of the electrical connection of the spark gap 22 and for this purpose is provided at the lower surface of its supporting member 32 with an electrical contact 54 preferably in the form of an outwardly extending leaf having a terminal portion 56 for contact with the sliding switch member 26, the construction of which will be later described. Also attached to contact 54 as by nut 62 is a cable 58 provided with a quick disconnect device 60 at the opposite end thereof for interconnection with the high voltage feed from the engine coil. Electrical connection 50 in turn serves not only to both electrically and mechanically interconnect the leaf spring 46 with the upper needle point 30 but further serves to electrically engage at one end thereof a lead 64 adapted for interconnection at its other end as through known quick disconnect means 66 to the spark plug of the particular engine cylinder corresponding to that connected with high voltage lead 58. A further contact 68 preferably of the reverse U-shaped configuration depicted is positioned beneath the support 32 and forms a part of connection 50.

The third connection 24 is the ground connection previously mentioned. Such is supported as depicted by fixed member 32 and disposed longitudinally removed from the intermediate connection 50. It is also provided with a contact 70 of the downwardly extending leaf type similar to contact 54 and also having a terminal portion 72 for contact with a slide switch. Grounding to the engine is provided by a ground cable 73 having connection attachment means.

A slide contact 74, preferably of a U-shaped configuration, is mounted by conventional fastening means 76 to a slide 78 which may be in the form of a rod or block projecting through an opening formed in the front panel 14 of the housing 12. Such means comprise the switch 26 which is accordingly positionable in various attitudes and by reason of the longitudinal extent of the contact 74 enables a bridging of the contacts 54, 68 and 70 to sequentially close the various circuits shown in FIG. 4 of the drawings and thus enable the analyzing functions of the present device to be carried out in the manner as will hereinafter be explained. The slide 78 is preferably provided at its lowermost surface thereof with a series of notches 80 for contact with an upwardly biased spring member 82 and accordingly serves as a detent means by which the various of three possible contact positions of the device are delineated. The slide 78 also includes a handle or button portion 84 for convenience in manipulation between various contacting circuit positions.

The operation of the device is as follows: The analyzer 10 is connected to the engine as previously indicated, that is, ground cable 73 is attached to the metal block or other suitable ground and cables 58 and 64 suitably attached to coil leads and plugs respectively. To analyze the spark at starting RPM, position all slide switch members 26 to their full in position wherein contact 74 bridges contacts 68 and 70 and thus activates circuit 1. This position (ground outs) the high tension voltage to the spark plugs with spark showing at the spark gap 22 of the device. The spark gap 22 is set to engine manufacturers test specifications or as desired, by gap adjusting means 40. The engine is then cranked and the spark at spark gap 22 observed, in essence simultaneously for each cylinder. The strength of the spark will indicate spark quality e.g. good spark, no spark, intermittent or weak and for which cylinders. When the spark does not jump the gap setting on one or more cylinders, the gap can be decreased and again checked for spark to analyze faulty insulation, cracked distributors, weak output etc.

To analyze the spark while the engine is running the switch 26 is positioned in its full out position wherein contact 74 bridges contacts 54 and 68 and activates circuit 2. This position sends spark to spark plug without going through spark gap and in such position the engine may be started and run normally. Thereafter by switching to the intermediate position wherein contact 74 engages contact 68 solely the spark across spark gaps 22 may be observed after setting spark gap selector 40 to run position (normally 1/16 to 3/16 inch gap). Such test will indicate spark quality e.g. good spark, no spark, intermittent or weak and for which cylinders. Insulation breakdown can be detected by increasing or decreasing spark gap 22. Spark quality can be analyzed under various operating conditions e.g.; high RPM, idle, acceleration, deceleration etc.

To analyze combustion power output of each cylinder as measured by loss of RPM; position switches 26 to full out (normal run) circuit 2 position. With engine still running set spark gap selector 40 to a run position (normally 1/16 to 3/16 inch gap) which may be indicated by knob 42 and run engine at desired RPM. After noting the RPM when all cylinders are functioning then position switch 26 one at a time, to the full in circuit position (shuts off spark to spark plug) and not drop in RPM, comparing all cylinders. Little or no drop on one or more cylinders indicates faulty combustion which may be due to stuck piston rings, leaking seals, faulty carburetor etc. For multiple carburetors two or more cylinders may be cut off at a time to analyze which carburetor may be at fault.

While there is shown and described herein certain specific structure embodying the invention, it will be manifest to those skilled in the art that various modifications of the parts may be made without departing from the spirit and scope of the underlying inventive concept and that the same is not limited to the particular forms herein shown and described except insofar as indicated by the scope of the appended claims.

What is claimed is:

1. An engine analyzing device for testing both ignition and combustion power of a multiple cylinder engine comprising: the combination of a housing including a plurality of directly observable adjustable spark gaps having electrical connections on opposite sides thereof and a ground connection spaced therefrom, means for electrically connecting the high tension ignition lead of each of said cylinders to one side of its respective gap and the spark plug of said cylinder to the other side thereof, and a plurality of switches for each such cylinders and movable to first, second and third positions wherein the first position connects the spark plug side of said gap with said ground whereby high tension voltage is directed through said gap and then to ground of each respective cylinder, said second position makes no connection between said gap sides and ground whereby high tension voltage is directed through said gap and then to the spark plug of said respective cylinder and said third position interconnects said opposite sides of said gap whereby high tension voltage bypasses said gap and is directed directly to said spark plug of said respective cylinder whereby each of said gaps may be adjusted while said engine is running and whereby each of said gaps may be simultaneously observed both when said engine is running and when not running.

2. The device of claim 1, each said spark gap comprising an opposed pair of needle points.

3. The device of claim 1 including supporting means for the electrical ground and spark gap connections, said switch spaced from said supporting means to provide an air gap therebetween to prevent carbon tracking between said connections.

4. The device of claim 3 including a common supporting surface disposed intermediate of said housing for supporting said respective connections of each of said cylinder in side-by-side spaced relationship, said connections outwardly projecting from said intermediate supporting surface for serial contact with said switch in turn spaced to one side of said supporting surface.

5. The device of claim 4, said connections for each respective cylinder arranged in line along a longitudinal plane projecting from the front to the rear of said housing, said switch being a slidable bar having a longitudinally orientated contact outwardly projecting therefrom, said bar slidable in a path parallel to said line within said plane.

6. The device of claim 5, each of said spark gaps comprising an opposed pair of needle points, one of each pair positioned on said intermediate support and means for simultaneously adjusting said spark gaps comprising a plate pivotally suspended at one end thereof within said housing on the other side of said intermediately disposed support, said plate positioning the other of each of said pairs of points above said one thereof at the other end thereof and actuation means for moving said other end of said plate towards and away from said intermediate support.

7. The device of claim 6 wherein the means for moving said plate away from said support comprises a leaf spring spanning and interconnected to both said plate and said intermediately disposed support and serving to electrically connect the other of said needle points of each said pair with its respective spark plug side of said gap.

8. The device of claim 2, said means for simultaneouly moving one of said points of each of said pairs comprising a pivotally movable plate, the other of each said pair positioned on said intermediate support, and means for separately adjusting said one points towards said other points, said adjusting means comprising a plurality of aligned threaded openings provided in said plate, said one needle points of said pairs thereof having external threads adapted for interengagement with the threads of said openings wherein said one needle points project through said plate and a jam nut engaged with said projecting portion of each said needle point on the opposite side of said plate.

* * * * *